(12) United States Patent
Schauz

(10) Patent No.: US 7,276,267 B2
(45) Date of Patent: Oct. 2, 2007

(54) METHOD FOR THE MANUFACTURE OF AN INJECTION MOLDED CONDUCTOR CARRYING MEANS

(75) Inventor: Stephan Schauz, Geislingen/Steige (DE)

(73) Assignee: Festo AG & Co., Esslingen (DE)

( * ) Notice: Subject to any disclaimer, the term of this patent is extended or adjusted under 35 U.S.C. 154(b) by 648 days.

(21) Appl. No.: 10/617,925

(22) Filed: Jul. 11, 2003

(65) Prior Publication Data

US 2004/0104040 A1    Jun. 3, 2004

(30) Foreign Application Priority Data

Jul. 18, 2002    (EP)    .................... 02015961

(51) Int. Cl.
   *B05D 5/12*    (2006.01)
   *B05D 3/00*    (2006.01)
(52) U.S. Cl. .................... 427/554; 427/555; 427/96.1; 427/98.5; 427/98.6; 427/99.5
(58) Field of Classification Search ............... 427/96.1, 427/554, 555, 99.5, 98.5, 98.6
   See application file for complete search history.

(56) References Cited

U.S. PATENT DOCUMENTS 4,812,275 A * 3/1989 Yumoto ....................... 264/129
4,812,353 A * 3/1989 Yumoto ....................... 428/172

FOREIGN PATENT DOCUMENTS

| | | | |
|---|---|---|---|
| DE | 19921660 A1 | | 11/2000 |
| EP | 0782765 B1 | | 6/2000 |
| GB | 2193847 | * | 2/1988 |
| GB | 2266410 | * | 10/1993 |
| JP | 06140734 | | 5/1994 |
| WO | WO 01/97583 | * | 12/2001 |
| WO | WO 01/97583 A2 | | 12/2001 |

OTHER PUBLICATIONS

Huske, M., et al., "Laser Supported Activation and Additive Metallization of☐☐ Thermoplastics for 3D-MIDS", Proceedings of the 3 RD Lane 2001, March 28-31,☐☐ 2001, XP002242586, Erlangen, Germany.*

Huske, M., et al., "Laser Supported Activation and Additive Metallization of Thermoplastics for 3D-MIDS", *Proceedings of the 3 RD Lane 2001*, 'Online! Mar. 28-31, 2001, XP002242586, Erlangen, Germany.

(Continued)

*Primary Examiner*—Brian K. Talbot
(74) *Attorney, Agent, or Firm*—Hoffmann & Baron, LLP

(57) ABSTRACT

A method making possible the production of an injection molded conductor carrying means composed of a first supporting substrate and a second supporting substrate. The first supporting substrate comprises a basically metallizeable plastic material and the second supporting substrate a basically non-metallizeable plastic material. However the plastic material of the second supporting substrate is able to be activated by a laser beam. The laser activation produces a metallization pattern on it and such pattern is connected with uncovered areas of the first supporting substrate, following which a common treatment takes place which results in an electrical conductor arrangement being produced. The invention furthermore relates to a conductor carrying means produced by the method.

2 Claims, 2 Drawing Sheets

OTHER PUBLICATIONS

"Gute Verbindung", *Plastverarbeiter* 52. Jahrg (2001) Nr. 11, 92.
Lanxess, Durethan Product Description, date unknown.
LG Chem Lupoy GP-5200, Product Description, date unknown.
Ticona, Vectra Product Description, date unknown.
LPKF Laser & Electronics; PAMID Granulate Material Product Description, date unknown.

* cited by examiner

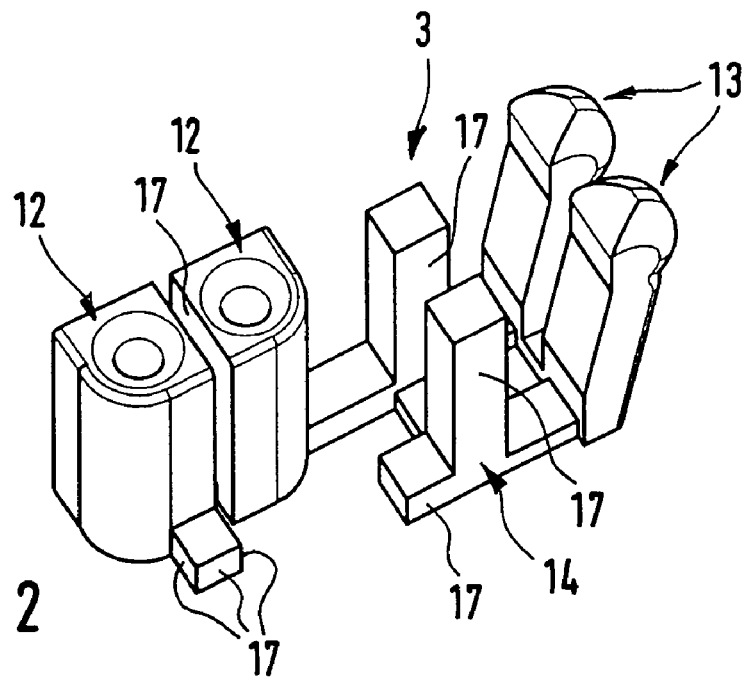
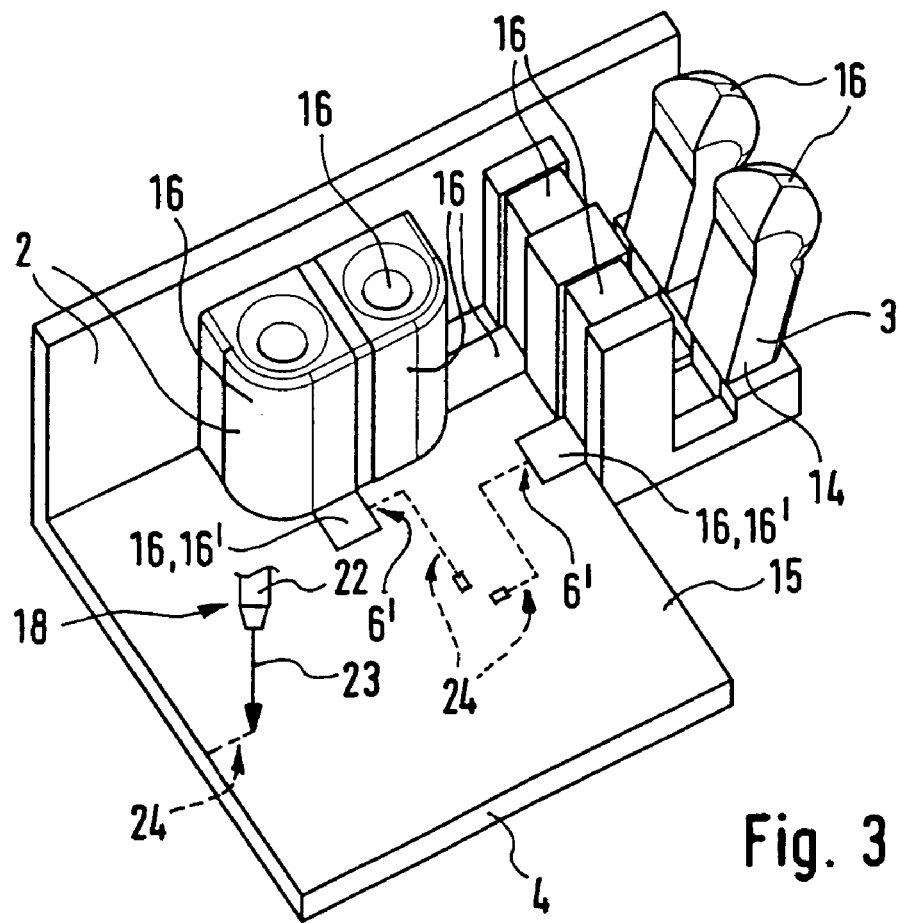

METHOD FOR THE MANUFACTURE OF AN INJECTION MOLDED CONDUCTOR CARRYING MEANS

BACKGROUND OF THE INVENTION

The invention relates to a conductor carrying means produced using a dual component injection molding method in so-called molded interconnect device (MID) technology and to a novel method of manufacture.

THE PRIOR ART

Injection molded conductor carrying means manufactured using such MID technology are coming to be employed on an increasing scale, because unlike conventional printed circuit boards they render possible the production of complex three-dimensional conductor structures. The European patent publication 0 782 765 B1 describes possible structures and instrumentalities of and, respectively, mounted on such conductor carrying means, a supporting substrate consisting of thermoplastic plastic material being employed as the base in the form of an injection molding, on whose surface printed wiring with the desired configuration is produced. The printed wiring is in this case the result of laser grain producing treatment the supporting substrate which has previously been metallized over its full surface.

A further injection molding method, which is also frequently utilized, is the so-called dual component injection molding process. In this case a first plastic material, which is in principle able to be metallized by electroplating, is employed to produce a first supporting substrate by injection molding, on which using a suitably configured injection molding mold a second supporting substrate, which is in principle not able to be metallized, made of a second plastic material is molded, predetermined areas of the first supporting substrate not being covered. In a following electroplating process a metallization layer, functioning as a conductor arrangement, is deposited on the uncovered area of the first supporting substrate.

In recent times a form of MID technology involving direct laser grain producing treatment has come into use. In such method, as described for example in the periodical "PLASTVERARBEITER" fifty-second year (2001), no. 11, page 92, the circuit layout is produced on a high performance plastic (for example so-called PBTMID, PA6/6TMID) by activation of predetermined surface areas of the supporting substrate, which inherently is unable to be metallized, by means of a laser beam following the desired printed wiring configuration, on which areas, by ensuing metallization, a metal layer is applied to form the desired printed wiring.

While the dual component injection molding method is overwhelmingly employed for the production of complex structures with a highly three-dimensional character, and more particularly in cases, in which vias, large contact surfaces or undercutting is required, the laser beam activation in accordance with the direct laser grain producing treatment is primarily employed in cases, in which extremely fine conductor traces or finely distributed conductor patterns are necessary.

SHORT SUMMARY OF THE INVENTION

One object of the invention is to suggest measures which render possible relatively simple production of conductor carrying means which are both complex and also include fine details in their conductor structures.

In order to achieve these and/or other objects appearing from the present specification, claims and drawings, in the present invention in the case of an injection molded conductor carrying means comprising a first supporting substrate consisting of a first plastic material able in principle to be metallized, on which by using injection molding a second supporting substrate is so formed that the first supporting substrate remains partially uncovered, the second supporting substrate consisting of a second plastic material in principle not able to be metallized while however being able to be activated by a laser beam, and an electrical conductor arrangement extending over the two supporting substrates, such electrical conductor arrangement consisting of a metallized layer deposited on uncovered areas of the first supporting substrate and on areas, activated by a laser beam, of the second supporting substrate.

The aim of the invention is furthermore achieved by a method for the production of an injection molded conductor carrying means with the use of a dual component injection molding method, in the case of which a first plastic material, which is in principle able to be metallized, and a second plastic material, which is in principle not able to be metalized but is able to be activated by a laser beam, are so formed or molded on each other that a substrate body is produced, which includes a first supporting substrate consisting of the first plastic material and a second supporting substrate made of the second plastic material partially covering the first supporting substrate, following which a metallized pattern is produced on the second supporting substrate by laser beam activation, which pattern at least partially adjoins one or more uncovered areas of the first supporting substrate and following which a metallized layer is deposited simultaneously on the metallization pattern and on the uncovered areas, such metallized layer being able to be utilized as an electrical conductor arrangement.

The invention is accordingly based on the inherently known dual component injection mold method, but however utilizing a non-metallizable plastic material for the second supporting substrate, whose structure permits laser beam activation. Accordingly a conductor carrying means may be manufactured, which possesses metallizable areas which comprise the uncovered areas of the first supporting substrate and the areas, which are activated following injection molding by laser beam grain producing treatment, of the second supporting substrate. Accordingly it is possible to produce on a substrate body, which comprises the two supporting substrates, both relatively complex metallized areas with highly three-dimensional features, and also extremely finely detailed and thin metallized areas, which are connected at one or more points with each other. In the course of the ensuing metallization, something which may conveniently be performed by electroplating, a metallized layer is deposited on the metallized areas, whose configuration is in accordance with the previously set metallized areas. Accordingly conductor carrying means may be produced whose layout may be varied by the designer over an extensive range and nevertheless with an extremely high degree of precision.

As a further first supporting substrate it is convenient to utilize a first plastic material with the specification PA66-GF, PC/ABS or LCP (Vectra E820i-Pd), whereas for the second supporting substrate plastic material with the designation PA6/6TMID, PBTMID or PPMID is recommended, which are available from the company LPKF Laser & Electronics AG, 30827 Garbsen, Germany.

Further advantageous developments and convenient forms of the invention will be understood from the following detailed descriptive disclosure of one embodiment thereof in conjunction with the accompanying drawings.

LIST OF THE SEVERAL VIEWS OF THE FIGURES

FIG. 2 shows a first supporting substrate, produced in a first injection mold operation, of the conductor carrying means in accordance with FIG. 1.

Figure 1:
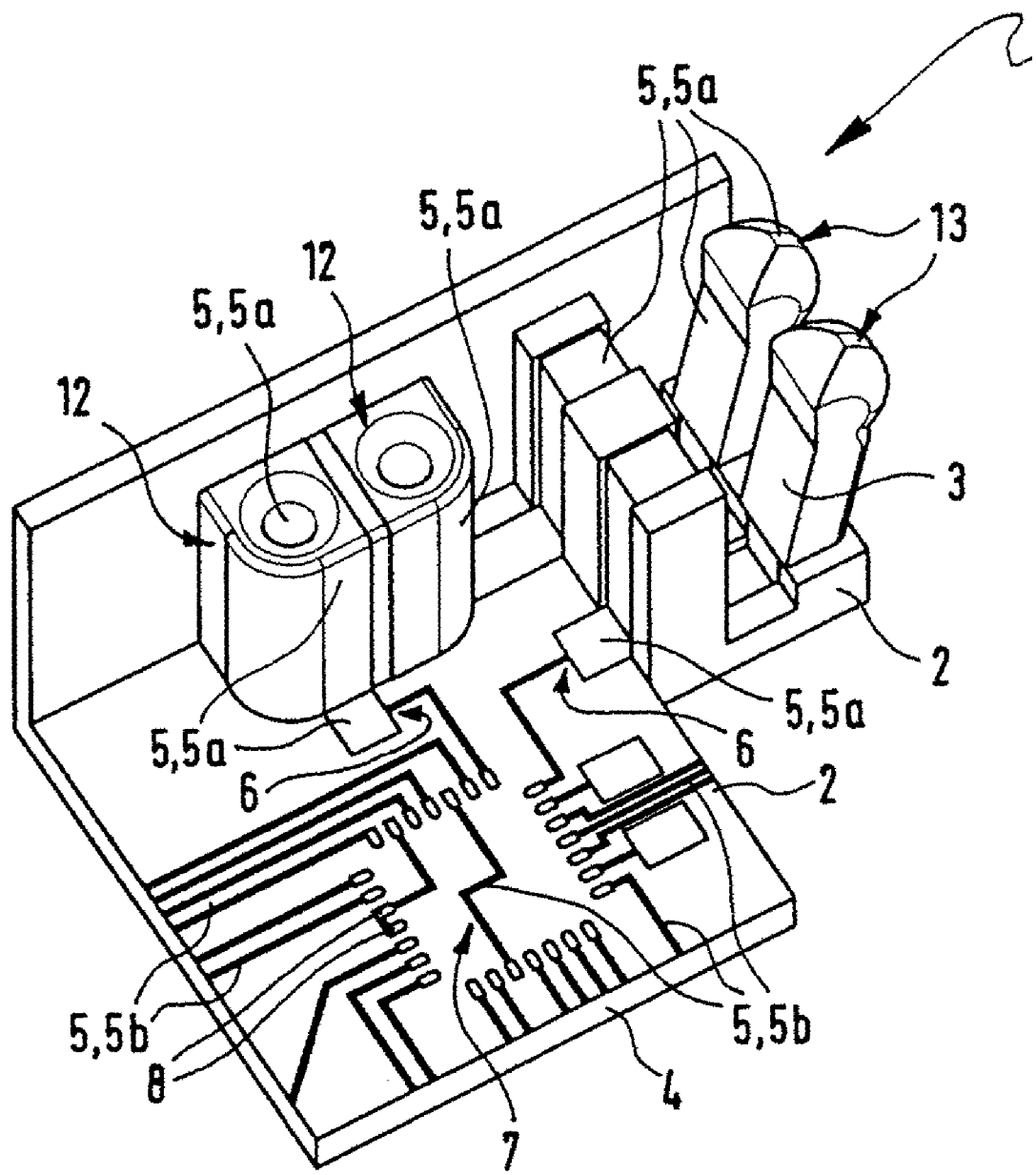
FIG. 1 shows a conductor carrying means produced using the method of the invention in one of many different possible configurations.

FIG. 3 a method stage in the case of which the second supporting substrate is formed or molded by injection molding on the first supporting substrate and in the case of which direct laser grain producing treatment using a laser beam is being employed to produce a metallization pattern as indicated in chained lines on the second supporting substrate.

DETAILED ACCOUNT OF WORKING EMBODIMENT OF THE INVENTION

FIG. 1 shows a conductor carrying means in accordance with the invention referenced 1, which has been manufactured using the production method in accordance with the invention. The injection molded conductor carrying means 1 is designed in the form of a three-dimensional MID component. It comprises a substrate body 2 including at least two different plastic materials, which is composed of a first supporting substrate 3 and a second supporting substrate 4 molded thereon by injection molding.

FIG. 2 shows the first supporting substrate 3 after its production by injection molding. This first supporting substrate 3 is conveniently produced before the second supporting substrate 4 in time. Following the production by injection molding of the first supporting substrate 3 the second supporting substrate 4 is molded on in any desired manner by injection molding on the first supporting substrate 3. Since the two supporting substrates 3 and 4 are made of plastic material the substrate body 2 constitutes a dual component injection molding.

The substrate body 2 is coated on its surface with an electrical conductor arrangement 5. It consists of a metallization, which is more especially deposited by electroplating predetermined parts of the substrate body 2.

First components 5a of the electrical conductor arrangement 5 extend on the first supporting substrate 3. Second components 5b of the electrical conductor arrangement 5 extend on the surface of the second supporting substrate 4. On one or more transitions 6 at least some of the first and second components 5a and 5b are electrically connected with one another, since here there is an uninterrupted metallization.

The second components 5b formed on the second supporting substrate 4 of the electrical conductor arrangement 5 could, as illustrated, represent a fine conductor structure. It is composed of one or more relatively thin conductor traces widths of the individual conductors with a size of below 100 µm being possible. The conductor arrangement 5 can, as illustrated, define a connection zone 7 on the second supporting substrate 4, at which connection zone 7 a plurality of elements of printed wiring terminate at connection pads 8 as defined by the metallization, at which an electronic component as for example a chip, may be contacted and secured in position. Accordingly an electronic circuit may be produced without any trouble.

While the second components 5b of the conductor arrangement 5 overwhelmingly only possesses a two-dimensional or merely slightly three-dimensional structure, the first components 5a may have an extremely complex and also a relatively pronounced three-dimensional structure. They are located in this case for example on the surface of one or more connection sleeves 12 or one or more spring contact elements 13, which are defined by suitable configuration of the first supporting substrate 3. Instead of connection sleeves 12 it would also be possible to have other, different connection components. Furthermore, the electrical conductor arrangement could be located on the first supporting substrate 3, for example at screen areas or at vias.

DESCRIPTION OF THE PREFERRED MANNER OF PRODUCTION OF THE INJECTION MOLDED SUPPORTING SUBSTRATE

During production firstly the first supporting substrate 3 is produced using a first plastic material 14 using injection molding. The configuration of the first supporting substrate 3 will be dependent on the desired structure of the conductor carrying means 1, which in turn will depend on the purpose of use. For instance, it is possible for the conductor carrying means 1 to be a component of an electronic control or a sensor, but however all other fields of application remain open, for example as components of electronic circuits in communication technology or in automation.

The first supporting substrate 3 produced by injection molding has inter alia the connection sleeves 12, still uncoated, and the contact elements 13.

The first plastic material 14, on which the first supporting substrate 3 is produced, is basically able to be metallized. Accordingly it is suitable for being metallized in a conventional fashion as for example described in the said European patent publication 0 782 765 B1, all over the surface.

As a plastic material it is more particularly recommended a to use plastic with the specification PA66-GF, PC/ABS or LCP (Vectra E820i-Pd).

A second plastic material 15 is molded on the first supporting substrate 3 produced by injection molding in a following injection molding operation, such material 4 constituting the second supporting substrate 4 in the cured condition. We then have the substrate body 2 illustrated in FIG. 3, which is composed of the two plastic components 14 and 15 and, respectively, the two supporting substrates 3 and 4. The substrate body 2 is a rigid structural unit.

The molding or injection of the second plastic material 15 onto the first supporting substrate 3 is implemented in such a manner that predetermined areas of the first supporting substrate 3 are covered by the second plastic material 15 while other areas remain uncovered and bare. Various different uncovered areas are indicated in FIG. 3 by reference numeral 6'. Such areas, which are covered by the molded second plastic material 15, are indicated in FIG. 2 at 17 as examples.

The selective leaving bare and covering of predetermined areas of the first supporting substrate 3 is performed by suitable design of the injection mold, in which the second plastic material 15 is molded on the first plastic material 14 and, respectively, the first supporting substrate 3.

The second plastic material 15 is such that it is in principle not able to be metallized. It may hence not be metallized using conventional steps as for instance described in the said European patent publication 0 782 765 B1.

The second plastic material 15 however has preferably the further property of being able to be activated by a laser beam. On the basis of such material property the second supporting substrate 4 is subject to direct laser grain producing treatment after manufacture by molding of the substrate body 2 on the surface in selected areas. A representation of this activation operation is indicated in FIG. 3 at 18. Here it will be seen that a laser 22 is so swept by means of a mechanical positioning means (not illustrated in detail) that its beam 23 produces a metallization pattern 24 indicated in chained lines on the surface of the second supporting substrate 24.

The second plastic material is for example a PBT (polybutylene terephthalate) plastic optimized for MID applications, the plastic material being provided with embedded laser activatable metal particles or, respectively, metal seeds, as for example of palladium or copper. It is a question of for example a plastic material with the designation PA6/6TMID, PBTMID or PPMID which is available from the company LPKF Laser & Electronics AG, 30827 Garbsen, Germany.

The laser beam caused to sweep over the surface of the second supporting substrate 4 produces a local activation of the substrate surface, by which the desired circuit layout is made. In the affected surface areas there is a local activation of material. On the one hand metal seeds composed of special purpose, non-conductive active substances are split or the metal seed casing is broken open. At the same time it is possible for further fillers of the plastic material to produce a pronounced roughness of the irradiated surface areas. This means that correspondingly activated metallization patterns 24 are produced on the second supporting substrate, which inherently is not able to be metallized, and on such patterns a metallized layer is able to be produced in a following electroplating metallizing operation. In the area with the split off and partially exposed metal seeds for example a local metallization with copper is produced following the laser beam trace, the roughness leading to an extremely satisfactory adhesion for the metal coating or layer produced in the electroplating bath.

After laser activation in predetermined areas of the second supporting substrate 5 there is consequently a substrate body 2 having a plurality of surfaces able to be metallized by electroplating. In the case of such surface areas able to be metallized by electroplating it is on the one hand a question of the bare areas 16 on the first supporting substrate 3 and on the other hand the metallization pattern 24 produced direct laser grain producing treatment.

The substrate body 2 is now as a whole subjected to an electroplating treatment, and the metal contained in the electroplating bath, more especially copper, is deposited in the above mentioned zones. The result continuous metallization in the said zones, which constitutes the electrical conductor arrangement 5 (see FIG. 1).

At the transitions 6 the metallization pattern 24 has been previously so formed that at the corresponding surface areas 6' it directly adjoins a bare area 16 of the first supporting substrate 3. Accordingly a continuous, uninterrupted metallization or metal coating is produced at the transitions 6.

It is convenient to utilize as a starting point for the surface areas 6' large pad-like bare areas 16' of the first supporting substrate 3. It is in this manner that it is possible to ensure an extremely reliable connection between the metallization pattern 24 and the bare areas 16.

It will be clear that the method in accordance with the invention leads to a highly flexible conductor layout design. In this respect both highly three-dimensional structures and also fine conductor structures may be produced using one and the same chemical treatment. The method is hence able to be employed in an extremely rational manner.

The invention claimed is:

1. A method for the production of an injection molded conductor carrying means with the use of a dual component injection molding method, in the case of which a first plastic material, which is in principle able to be metallized, and a second plastic material, which is in principle not able to be metallized but is able to be activated by a laser beam, are so formed or molded on each other that a substrate body is produced, which includes a first supporting substrate comprised of the first plastic material and a second supporting substrate partially covering the first supporting substrate comprised of the second plastic material, following which a metallization pattern is produced on the second supporting substrate by laser beam activation, which pattern at least partially adjoins one or more uncovered areas of the first supporting substrate and following which a metallized layer is deposited simultaneously on the metallization pattern and on the uncovered areas, such metallized layer being able to be utilized as an electrical conductor arrangement.

2. The method as set forth in claim 1, wherein the metallization pattern adjoins uncovered areas of large size on the first supporting substrate.

* * * * *